United States Patent [19]

Streit et al.

[11] 4,028,564

[45] June 7, 1977

[54] COMPENSATED MONOLITHIC INTEGRATED CURRENT SOURCE

[75] Inventors: Klaus Streit, Tubingen; Adolf Kugelmann, Leonberg; Hartmut Seiler, Reutlingen, all of Germany

[73] Assignee: Robert Bosch G.m.b.H., Stuttgart, Germany

[22] Filed: June 13, 1974

[21] Appl. No.: 478,974

Related U.S. Application Data

[62] Division of Ser. No. 289,161, Sept. 14, 1972, abandoned.

[30] Foreign Application Priority Data

Sept. 22, 1971 Germany .......................... 2147179

[52] U.S. Cl. ................................ 307/310; 307/297; 307/299 B; 307/303; 357/28; 357/44; 330/23; 330/38 M
[51] Int. Cl.² .......................................... H01L 27/06
[58] Field of Search ................... 357/28, 34, 86, 35, 357/44; 307/310, 297, 299 B, 303; 330/23, 38 M

[56] References Cited

UNITED STATES PATENTS

| | | | |
|---|---|---|---|
| 2,991,424 | 7/1961 | Wolfendale | 307/310 |
| 3,370,244 | 2/1968 | Higgenbotham | 330/23 |
| 3,668,541 | 6/1972 | Pease | 330/23 |
| 3,801,923 | 4/1974 | Russell et al. | 357/35 |
| 3,822,387 | 7/1974 | Mulder | 307/299 B |

*Primary Examiner*—Michael J. Lynch
*Assistant Examiner*—Joseph E. Clawson, Jr.
*Attorney, Agent, or Firm*—Flynn & Frishauf

[57] ABSTRACT

A main semiconductor element is placed on a circuit chip; additionally, a compensating semiconductor element is placed thereon, the compensating semiconductor element being a diode, a substrate diode, a Schottky diode, a transistor with shortcircuited base emitter junction, open base transistor, or a resistor, the additional semiconductor element having one terminal connected to the main semiconductor and the other terminal either to the substrate or to a source of potential at least as large as the potential of the main element. The leakage current to be bypassed may affect the main element directly, particularly when the main element is operated in digital on-off mode, or indirectly by passing a compensating current which affects another element such as an operational amplifier, or provides directly for additional current compensating for leakage current of the main element. Placing the additional element on the same substrate and making the element of approximately the same surface extent provides for comparable passage of compensating leakage current over a wide range of semiconductor crystal temperatures.

3 Claims, 29 Drawing Figures

COMPENSATED MONOLITHIC INTEGRATED CURRENT SOURCE

This is a division of application Ser. No. 289,161, filed Sept. 14, 1972 now abandoned.

The present invention relates to monolithic integrated circuit technology and more particularly to a system and arrangement to bypass, or compensate for leakage or residual current arising in integrated circuits utilizing monolithic chips, especially when the temperatures of the crystal rise, so that proper operation of the semi-conductor elements on the chips is insured even though the leakage currents may be in the order of the normal working currents or control currents of the devices.

Monolithic, integrated circuits in which many elements, with high packing density, are placed on a chip may cause heat to arise within the semi-conductor crystal which can be removed only insufficiently. Thus, the elements of the integrated circuit may operate at much higher crystal temperature than discrete, separate semi-conductor elements. The leakage or residual currents of the elements rise roughly exponentially with temperature. In digital circuits, these leakage currents must be bypassed or drawn off; in analog circuits, compensation for these leakage currents must be provided.

Various circuits and methods have been proposed to bypass, draw off or compensate for leakage currents; such methods, when used with semi-conductor elements in discrete circuits are not usually applicable to integrated circuits on a single crystal substrate. Thus, residual or leakage currents can be bypassed by means of bypass resistors. Circuits in which the working or control currents are very low require such bypass resistors of high value. Such high value, high resistance bypass resistors can be constructed on monolithic integrated circuits only with comparatively large use of crystal surfaces and, therefore, are preferably not used therewith. For analog circuits, compensation by means of controllable, variable compensating circuits can be obtained for leakage currents; such separate compensating circuits are difficult to construct on integrated circuits.

It is an object of the present invention to provide circuit arrangements or systems which are capable of drawing off, bypassing, or compensating leakage or residual currents which, particularly when operating with high crystal temperatures, are in the same order of magnitude as the effective working currents of semi-conductor elements, particularly when formed as integrated circuits.

Subject Matter of the Present Invention

Briefly, the integrated circuit chip is formed with additional circuit components and so connected that the residual or leakage current of these additional components can be utilized to draw off or compensate for the leakage currents of the circuit elements which are utilized in the circuit structure itself. The elements to draw off, or compensate for leakage currents are on the same crystal as the circuit elements which carry out the circuit functions under consideration, and thus the characteristics of the residual current effects of the additional circuit elements will be effectively the same as the characteristics of leakage current effects of the circuit elements themselves. This is due to the uniformity of the crystal during manufacture thereof and the small temperature differences obtaining on the crystal itself. This tight coupling has the additional advantage that leakage currents, to be compensated or drawn off by additional elements will not have an effect when the additional elements are not needed, for example, when the crystal temperature is low. Thus, undesirable side effects and additional circuit effects of the compensating or bypassing elements are avoided, for example, the well known loss in control current when bleeder resistors are used as compensating elements.

The invention will be described by way of example with reference to the accompanying drawings wherein:

FIG. 7b is a schematic, expanded equivalent circuit including the structure of FIG. 7a.

Figure 1:
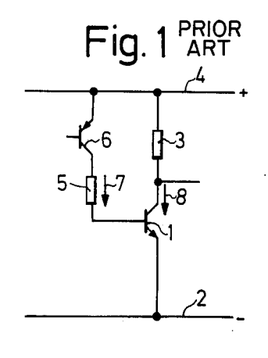
FIGS. 1 and 2 are schematic circuit diagrams of a transistor control circuit, in accordance with a prior art, FIG. 2 illustrating a compensated circuit.

Before discussing the solution afforded by the invention, the problem which arises with leakage currents in semiconductors, and the specific problem in integrated circuits will be explained in connection with the basic well known circuit according to FIGS. 1 and 2.

A transistor 1 has its emitter connected to negative terminal or bus 2 and its collector connected over collector resistor 3 to positive terminal or bus 4 of a supply of power. Transistor 1 is controlled by suitably biasing its base, for example, over a base resistor 5 by means of a switch 6, which, itself, may be a PNP transistor.

As well known, if the PNP transistor 6 blocks, still, a residual or leakage current 7 will flow to the base of the transistor 1. This leakage current 7, in the example illustrated, will be the sum of the leakage current 6 and of the leakage current of the resistor 5, assuming that resistor 5 itself is formed on an integrated circuit chip. For example, resistor 5 may be a p-type region diffused into an n-type tub, or trough-like region and connected with terminal 4, so that a residual current may flow from the trough region. The collector of transistor 1 will than have an undesirable leakage current 8 flowing therein, a portion of which results from the amplification of the current 7. The second portion of current 8 is the "open base collector-emitter" leakage current of transistor 1 itself which arises due to amplification of the leakage current of the base-collector diode of the transistor 1 which is not drawn off from the base, away from the transistor.

Figure 2:
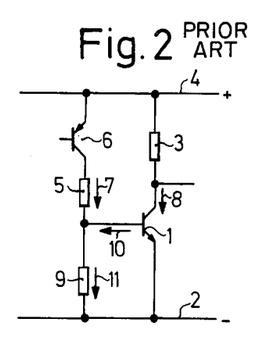

FIG. 2 illustrates a circuit, well known, in which the leakage control current 7 and the blocking current 10 of the base-collector diode portion of transistor 1 that is, the sum thereof indicated as current 11, is drawn off. Bleeder resistor 9 interconnecting the base and emitter of transistor 1 bypasses this combined leakage current 11. Difficulties arise, however, when transistor 1 is operated at high crystal temperatures. The combined sum current 11 through bleeder resistor 9 must, at highest crystal temperatures at which transistor 1 should still be blocked, generate only a small base-emitter voltage on transistor 1, usually only a few 100 mV. In order to hold down this current, the collector leakage current 8 of the transistor 1 must be reduced to the leakage current 10 of the base-collector diode plus a rather small blocking current of the n-conductive collector region in the p-conductive substrate. As a result, the bleeder resistor 9 must be small. This, then, has the effect that a comparatively large portion of the control current derived from switch 7 — in the example also a transistor — is bypassed to the negative terminal 2. This control current which, in many instances already is of marginal value, may therefore be insufficient to effectively and reliably control transistor 1 under all operating conditions to change it between blocking and unblocked condition under control of transistor 6.

Figure 3A:
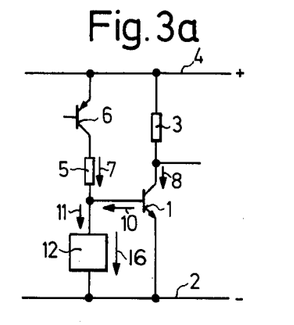
FIGS. 3a and 3b are schematic circuits of an arrangement in accordance with the present invention.
Figure 3B:
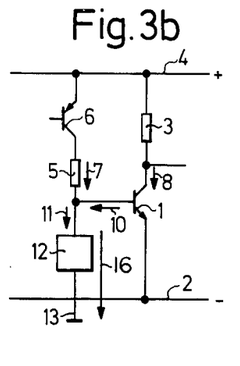

The solution to the problem will be discussed in connection with FIGS. 3a and 3b. In accordance with the invention, a bleeder resistor 9 is replaced by an additional semiconductor element 12. This additional semiconductor element can be connected between the base and the emitter of the transistor to be blocked, in accordance with FIG. 3a, or, as seen in FIG. 3b, can be connected between the base and a point on the circuit which is of lower potential than the emitter, preferably the substrate 13 of the integrated circuit. Of course, the circuit may include a combination of the elements in accordance with FIGS. 3a and 3b, that is, element 12 is connected to the base and to a terminal or terminals, at a voltage or voltages which is, or are at least as low as that of the emitter voltage of transistor 1. In accordance with the invention, the element 12 is so selected and dimensioned that at high crystal temperatures, and with a small voltage 14 applied, for example of about 100 mV as indicated by arrow 14 at FIG. 3c, a leakage current 15 will be drawn which reliably is as great and preferably greater than the total current 11 to be drawn off. Voltage 14 across the element 12, due to current 11 (FIG. 3a, FIG. 3 b) will then reliably be less than the voltage 14 of FIG. 3c. The base-emitter diode of transistor 1, then, in accordance with the circuit of FIG. 3a will have a small enough voltage there across so that the transistor 1 will be held in blocking condition even if the crystal temperatures should rise substantially. The circuit of FIG. 3b even permits the base-emitter diode of the transistor 1 to be biased in blocking direction.

Figure 4A:
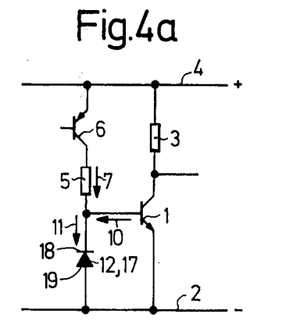
FIGS. 4a and 4b are schematic circuit diagrams of a specific realization of the circuits of FIG. 3a, and of FIG. 3b respectively.
Figure 4B:
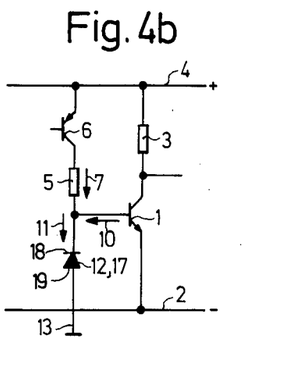

Referring to FIGS. 4a and 4b: The drainage or separate element 12 comprises a diode 17 having its cathode 18 connected to the base of transistor 1. The anode 19 of the cathode is connected, in accordance with FIG. 4a to the emitter of the transistor 1, that is, to the negative bus 2; in accordance with FIG. 4b it is connected to a somewhat lower voltage, that is, to the substrate 13.

The actual construction of the diode, with respect to the other circuit components and the substrate crystal chip is illustrated in FIGS. 4c to 4f. A particularly simple and space-saving construction of diode 17, in accordance with FIG. 4b, as a substrate diode is illustrated in 4c, in cross-section. Gate regions 20 which are heavily p-doped separate a slightly n-doped region 21, which may be trough or tub-like, and which is formed on the slightly p-type substrate 13 by epitaxial deposition. A heavily n-doped region 22 acts as an ohmic contact to which a metallic connection 23 is made, which forms the cathode 18 of the diode 17. Anode 19 is identical to the substrate 13.

Figure 3C:
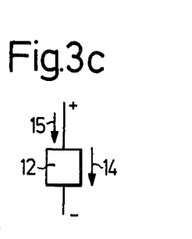
FIG. 3c is a fragmentary circuit used in the explanation of the operation of the circuit.

The blocking current 15, in accordance with FIG. 3c, which would flow in the substrate diode upon applied potential 14 is greater by an adequate safety factor than the sum of the current 11 to be drained. The sum of the residual leakage currents rise eponentially at approximately the same rate, with temperature, so that the safety factor will be available for a very wide temperature range. Voltage 16 on the substrate diode will be small and the transistor 1 will be reliably blocked. The leakage current, at room temperatures and below, is in the nano A order, so that it can usually be neglected.

Figure 4C:
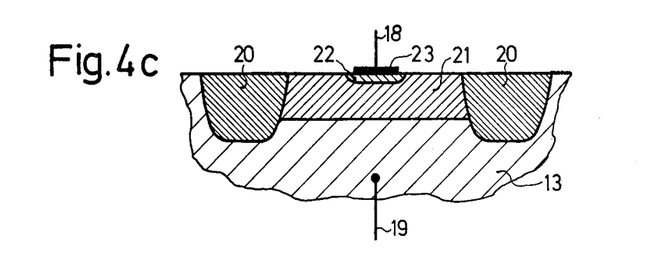
FIG. 4c to 4f are transverse schematic, cross sectional views through a crystal structure illustrating formation of portion of the integrated circuit in accordance with the present invention.
Figure 4D:
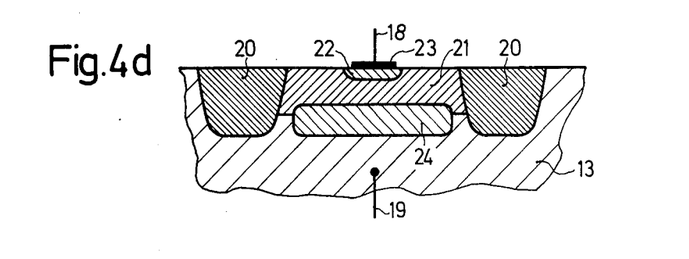
Figure 4E:
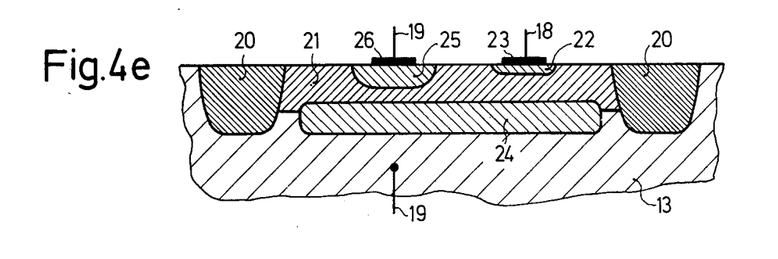

The substrate diode, as a drainage element 12 may also form part of a transistor or of a more complex arrangement, in which the base region, that is the tub-like region is connected to the base of the transistor 1. If a simple diode is used, or if a transistor is used, a conductive layer 24 may be utilized as illustrated in FIG. 4d. The element with conductive layer also has a residual or leakage current which flows, in part, across the p-n junction 21, 20 and in part over the p-n junction 24-13. The drainage diode 17, as illustrated in FIG. 4e, may be the base-collector diode junction of a transistor, the emitter of which is missing. With respect to FIG. 4d, the heavily p-doped base region 25 has been added, which is connected over contract 26 with the emitter of transistor 1 (FIG. 4a) or with the substrate 13 or a point at lower voltage (FIG. 4b). The conductive layer 24, shown in FIG. 4e, may be present, or may be omitted. The leakage current 15 in accordance with FIG. 3c then is the blocking current of the base-collector diode and the crystal region blocking current itself.

Figure 4F:
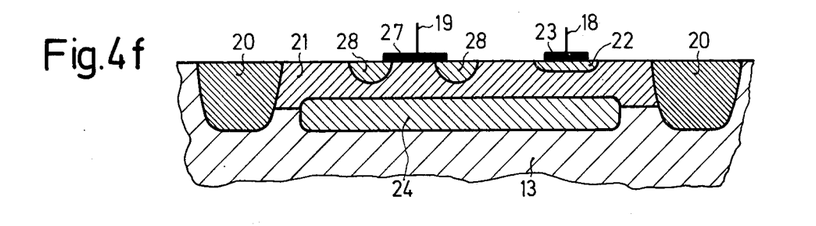

The drainage diode 17 may be a Schottky diode, as seen in FIG. 4f (schematically), the connection being selectively in accordance wih FIG. 4a or 4b. The p-type zone 25 of FIG. 4e is replaced by the metal semiconductor contact 27 which may, additionally, be surrounded by a so-called guard ring 28. The conductive layer 24, indicated in FIG. 4f, may be present or may be omitted.

Figure 5A:
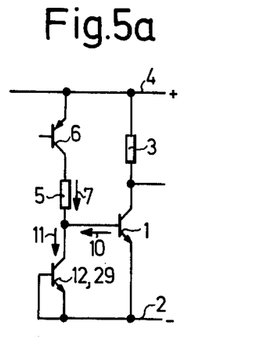
FIGS. 5a and 5b are schematic circuit diagrams showing another embodiment of the circuit broadly disclosed in FIGS. 3a, 3b.
Figure 5B:
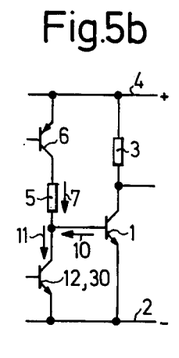

FIG. 5a and 5b illustrate connections of the additional semiconductor element in the form of a transistor. FIG. 5a illustrates transistor 29 with short circuited base emitter diode which, effectively, is practically the same as the base-collector diode illustrated in FIG. 4e.

FIG. 5b illustrates the transistor 30 with open base connection, which is capable of draining a much greater leakage current 11 since, besides the crystal leakage current, the amplified leakage current of the base-collector diode (that is, the collector-emitter leakage current with open base) is available. This provides for a very large reserve or safety factor between the current which is to be passed and the current which can be passed by the device, particularly when the bypass transistor 30 should have a substantially smaller surface than transistor 1.

Figure 6A:
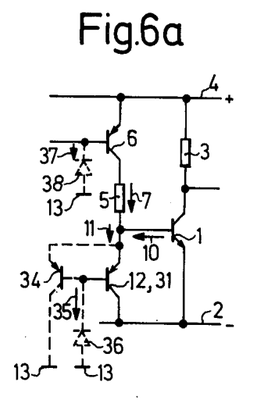
FIG. 6a is a schematic circuit illustrating another embodiment.
Figure 6B:
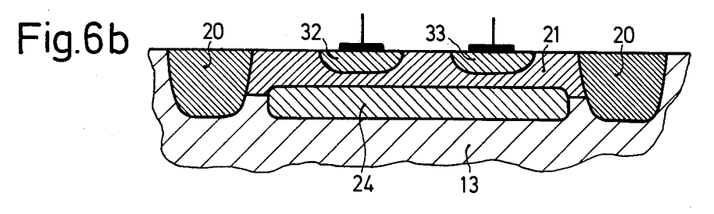
FIG. 6b and FIG. 6c are transverse sectional schematic views through crystal structures embodying the invention.

FIG. 6a illustrates the separate semiconductor element 12 as a lateral PNP transistor 31, operated with open base; a cross-sectional view of the lateral transistor 31 is illustrated in FIG. 6b. The n-type conductive region 21 has p-doped zone 32, 33 applid thereto, functioning as collector and emitter, respectively. Base 21, being open circuited, does not require a base terminal or contact connected. As illustrated in FIG. 6a, the lateral transistor 31 not only draws off current due to the collector-emitter leakage current; additionally, the generally referred to "parasitic" substrate transistor 34, having a base-emitter idential to those of the lateral transistor further contributes to draw off leakage current. The collector of this parasitic lateral transistor is formed essentially by the insulation zone 20, if there is a conductive layer 24 present; if the conductive layer 24 is, however, omitted, the collector is formed directly by the substrate. The amplified leakage current 35 of the substrate diode 36, amplified by the two PNP transistors additionally contributes to drawing off current from the main switching transistor 1 and the control switch 6.

The overall bypass current 15 (FIG. 3c) which is conducted off in the arrangement of FIGS. 6a, 6b depends on the current amplification of the PNP transistors. This is of advantage when the switch 6 is also a PNP transistor.

Current 7 in the circuit then, essentially, is the amplified substrate current 37 of the substrate diode 38 of the transistor 6 and can be effectively accepted by the lateral transistor 31, which can additionally draw an amplified substrate current 35. The collector-base leakage current 10 of the NPN transistor 1 can be drawn off by the substrate transistor 34, so there is ample capacity for by-passing all leakage currents, regardless of crystal temperature.

Figure 6C:
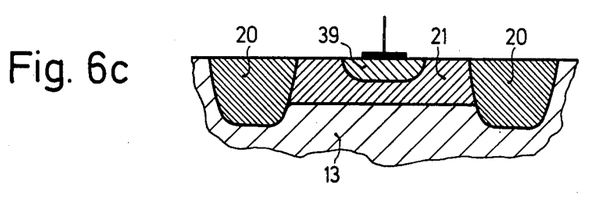

If switch 6 is not a lateral transistor, or if its leakage current is otherwise suppressed, for example, from the base thereof, a simple bypass transistor in the form of a substrate transistor, as illustrated in FIG. 6 c is sufficient. Such a transistor has a P-zone 39 functioning as an emitter placed in the region 21; less surface area is required by this construction. The conductive layer 24 may, or may not be provided. If conductive layer 24 is provided, then the current amplification is decreased.

The lateral transistor 31 utilized as the additional element 12 (FIG. 6a) can also be operated with short circuited base-emitter path. The drawing-off effect of such a connection is practically the same as that of the base-collector diode of FIG. 4e.

Figure 7A:
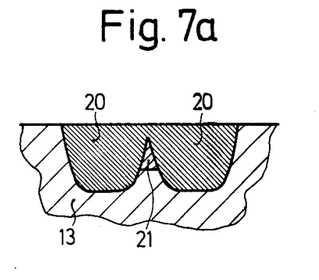
FIG. 7a is a transverse view through a crystal structure illustrating another embodiment.
Figure 7B:
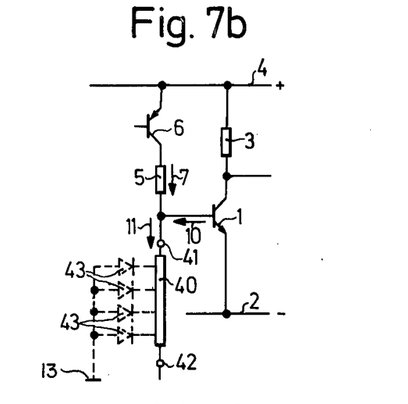

The embodiment discussed in connection with FIG. 3a, 3b and the diode 17 of FIG. 4c utilizes a little n-doped epitaxial region. Referring to FIG. 7a, the little p-doped isolation regions 20 are moved together to such an extent that the cross-sectional area of the expitaxial region 21 is highly compressed. FIG. 7a illustrates such an arrangement which should be considered as elongated in a plane transferred to the plane of the drawing. Region 21 then will form a high resistance epitaxial resistor 40, illustrated in the equivalent circuit of FIG. 7b, and connected in a circuit according to FIG. 3a or 3b, as desired. The resistor 40 can be provided to terminals 41, 42 which, in actual contruction, are widened portions of the region 21, similar, for example, to the construction of FIG. 4c. FIG. 4b illustrates the equivalent circuit and the use of the use of the resistor 40. Terminal 41 is connected to the base of the transistor 1. Terminal 42 is connected either to the emitter of the transistor 1, that is, to line 2 or to a point at lower voltage than line 2, for example the substrate 13. The high resistance resistor 14 operates as a bleeder resistor over the entire temperature region. Along the length of the resistor, a distributed substrate diode 43 is formed, shown in dashed lines in FIG. 7b, which has additional leakage currents as the crystal temperature rises. The combination of bleeder resistor together with the substrate semiconductor discharge element has the advantage with respect to the diodes of FIG. 4a, 4b, that the resistor can bleed off portions of the remaining current 7 which is independent of temperature. The resistor 40 can also be utilized to remove the base-emitter charge by quickly removing charge carriers if transistor 1 is to have short switching time.

Figure 8:
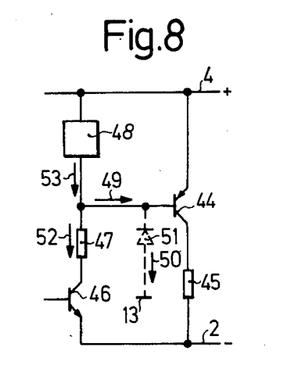
FIGS. 8 and 9 are schematic circuit diagrams illustrating the invention applied to a PNP transistor.

FIGS. 8–10b illustrate the application of the invention to blocking of a PNP transistor. FIG. 8 is an illustration of an arrangement complimentary to that of FIG. 3a, 3b. The lateral PNP transistor 44 has its emitter connected to positive terminal 4 of the voltage source and its collector connected to negative terminal 2 over a collector resistor 45. A switch 46 which, for example, is a NPN transistor controls the transistor 44 by having its emitter-collector path connected to the base of transistor 44 over resistor 47. If element 46 blocks, then the bypass element 48 which, in accordance with the prior art usually was a resistor, must ensure complete blocking of transistor 44. The leakage current 49 flowing in resistor 44 as well as the leakage current 52 derived from the controlled transistor 46, that is, the entire current 43 must be supplied by element 48. The major portion of the leakage current 49, indicated at 50, flows in the substrate diode 51, indicated in dashed lines, since it is the equivalent circuit of the base-collector diode of transistor 44.

Upon application of voltage, element 48 must now be capable of providing a current, or drawing a current, which reliably is greater than current 53, in order to maintain the base-emitter voltage across transistor 44 at the value which is small enough so that transistor 44 will not become conductive, even if the crystal temperatures rise to a higher than normal level.

In accordance with the invention, and analogous to the previously discussed examples in accordance with FIGS. 3–7, collectively, element 48 is again formed of components which have a leakage current characteristic similar to that of the transistor 44 and which can be utilized to draw off the leakage current 53.

Figures 9, 10A:
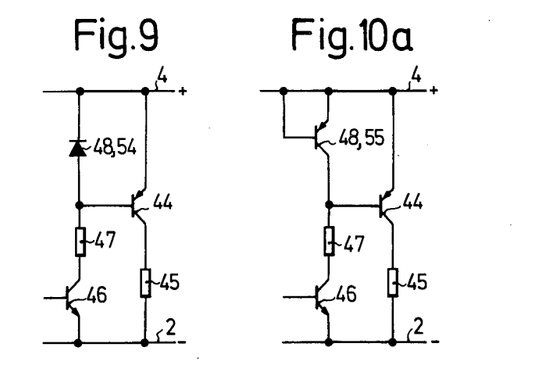
FIGS. 10a and 10b are circuit diagrams of the invention illustrated in FIG. 8 and showing other specific embodiments.
Figure 10B:
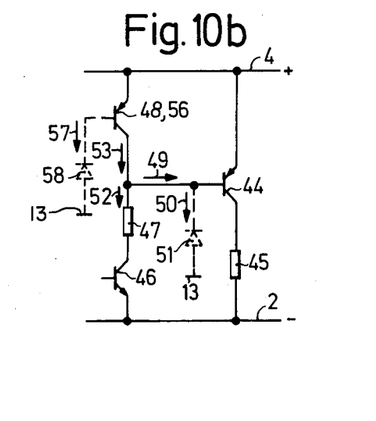

FIG. 9 illustrates a semiconductor element 48 in the form of diode 54, preferably the base-collector diode of NPN transistor, similar to FIG. 4e. FIGS. 10a and 10b illustrate the use of a lateral PNP transistor as the element 48. In FIG. 10a, a transistor 55 with short-circuited base-emitter terminals is connected similarly to the base-collector diode 54 in accordance with FIG. 9. A somewhat greater reserve, that is, a better safety factor to draw off leakage currents 49 and 52, is provided by the circuit of 10b in which the lateral PNP transistor 56, with open base, is provided. It can provide an amplified leakage current 57 of its substrate diode 58, indicated in dashed lines as the equivalent circuit. The lateral PNP transistor 56 can be made without base terminal, that is, as illustrated in FIG. 6b.

Figure 11:
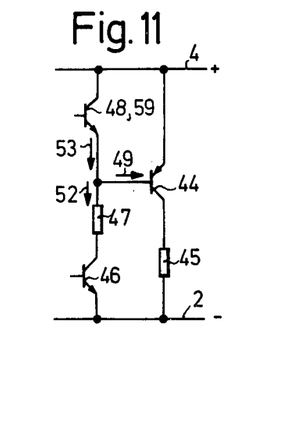
FIG. 11 is a schematic circuit of another embodiment of the invention in accordance with FIG. 8.

A NPN transistor 59 operating with open base is shown in FIG. 11, to form the semiconductor element 48. The relatively large collector-emitter leakage current of transistor 9 can be used to draw off the leakage current 53. It can readily draw off the remaining leakage current 52 even if switch 46, as an NPN transistor, is operated with open base. The NPN transistor 59 utilized as the semiconductor current compensating element could also be be operated with short circuited base-emitter terminals, under which conditions the current bypassing effect is practically the same as that of the base-collector diode 54 of FIG. 9.

The discussion heretofore was concerned with circuits in which the main element which was subject to leakage currents which were to be compensated, was operated digitally, that is, in an on-off mode. Under such operation it is important to have an element with sufficient reserve current passing capacity, without introducing substantial voltage drops, while still being capable of passing any possibly arising leakage currents.

When analog circuits are to be used in semiconductor technology, the leakage currents must be compensated as closely as possible so that spurious currents arising due to temperature changes will not interfere with analog operation of the device.

Figure 12:
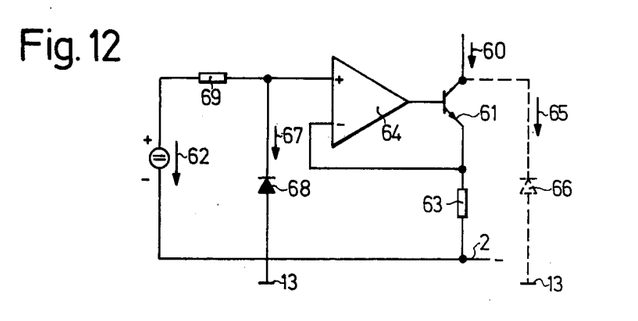
FIG. 12 is a schematic diagram illustrating the application of the invention to compensate for leakage currents in an analog circuit.

In accordance with the invention, the compensation element which is on the same chip of semiconductor substrate as that element which carries out the real circuit function is so arranged, in circuit, with respect to the real circuit elements that the leakage or residual currents are balanced by essentially similar compensation leakage currents. Referring to FIG. 12, the controllable current source provides an output current 60 which should be maintained at an accurate level, and be relatively small. Element 64 is an operational amplifier; under ideal conditions, operational amplifier 64 of FIG. 12 operates in such a manner that the controlled voltage 62 will likewise appear at the emitter resistor 63 of the current source 60. If the NPN transistor 61 has a high current amplification, then the output current 60 will be equal to the voltage 62 divided by the resistance of resistor 63. The transistor 61 could be replaced by a Darlington circuit.

At higher temperatures, the substrate current 65, which flows in the substrate diode 66 of transistor 61 (the equivalent circuit of which is shown in dashed lines in FIG. 12) adds an undesired component to the output current 60. This component 65 must be compensated. In accordance with the present invention, the substrate current 67 of an additional substrate diode 68 compensates for current 65. The diode 68 may be formed similar to the diode shown in cross section in FIG. 4c or 4d. The doped region of the substrate should have roughly the same area, or size, as the doped region of the transistor 61, so that the substrate currents 65 and 67, over a wide temperature range, will be very closely equal to each other. The resistor 69, having a resistance value to that of the emitter resistor 63 is then introduced between the input to the operational amplifier 64 and the connection of the voltage source 62. The voltage across resistor 63 will thus be reduced by that value which is caused by the leakage current 67 through diode 68 across resistor 69; the output current 60 will then have the desired value, that is, the value which would be simulated as if there were no substrate current 65.

Referring now to FIG. 13a to 13e: The substrate current (also known as trough remainder current) 73 which flows in the substrate diode 72 of a current supplying transistor 70, and thus forms an undesirable component of the final output current 71 must be compensated directly on the collector of transistor 70. In other words, the current through element 75 should simulate the current through the transistor 70 as if there were no additional substrate or trough remainder current 73.

Figure 13A:
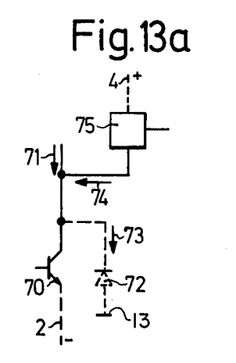
FIGS. 13a to 13e are schematic circuit diagrams illustrating various embodiments and ways of compensating for leakage currents in analog circuits.
Figure 13B:
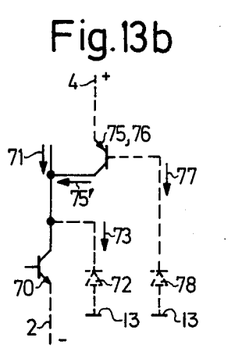

Compensation element 75, in accordance with the invention, provides a compensation current 74 which is approximately equal to the extra substrate current 73 which forms the component for which compensation must be provided. The compensation element 75, in accordance with FIG. 13b, is a lateral PNP transistor 76 operated with open base. The base terminal connection may thus be omitted, and the element can physically be made as previously discussed in accordance with FIG. 6b. The compensation current 75' is the substrate current 77 multiplied by current amplification of the lateral PNP transistor 76, and which flows in the substrate diode 78 of the lateral transistor 76. A relatively small additional collector-emitter leakage current of the lateral transistor 76 also is present. The doped region of the lateral transistor 76 thus must be slightly smaller than the region of the principal transistor 70, the reduction in space corresponding approximately to the factor of the average current amplification of the lateral transistor 76.

Figure 13C:
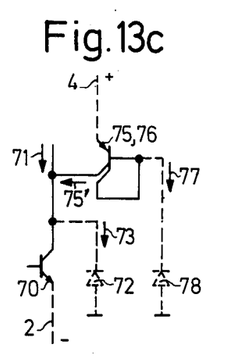

If the current amplification of the lateral transistor varies widely, then such an arrangement may result in difficulties. In known manner, the influence of the current amplification can be greatly decreased by providing the lateral transistor 76 with a second collector, as indicated in FIG. 13c, which is connected to its base. If both collectors are of equal size, then the current amplification of the feedback coupled arrangement is just below one and is relatively constant, so that in many cases compensation of substrate current 73 by the substrate current 77 can be adequately obtained, when both doped regions or zones of the transistors on the substrate are made essentially of equal size.

Figure 13D:
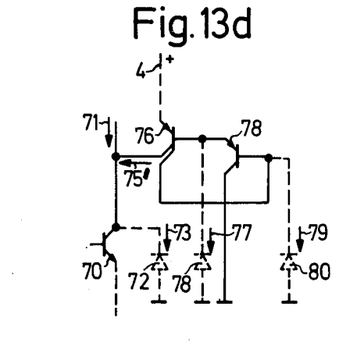

The influence of the current amplification of the lateral transistor 76 can be eliminated almost entirly by inserting a highly amplifying PNP transistor 78, as known and shown in FIG. 13d, or in the feedback loop. This PNP transistor, preferably, is a vertical substrate transistor in accordance with the construction of FIG. 6c. A base connection will then, of course, be necessary for the lateral transistor 76. If, in this arrangement, the substrate current of lateral transistor 76 would be missing, then the compensation current 75' would be exactly equal to the substrate current 79, which flows in the substrate diode 80 of the PNP transistor 78. To exactly compensate the substrate current 73 of the main or current source transistor 70, it would only be necessary to make the doped region of the PNP transistor 78 of equal size with that of the transistor 70. The substrate current 77 of the lateral transistor 76 still slightly interferes with exact compensation of the leakage or residual current. It may additionally become so great that the base current of the lateral transistor 76 is no longer capable of supplying the emitter current of the PNP transistor so that transistor 78 may block.

Figure 13E:
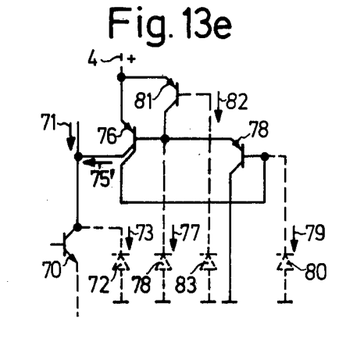

In accordance with the invention, and as illustrated in FIG. 13e, a further lateral transistor 81 is provided which is utilized to compensate the still interfering substrate current 77 and which supplies the amplified substrate current 82 which flows in the substrate diode 83, in order to ensure sufficient emitter current for PNP transistor 78. The lateral transistor 81 additionally supplies a collector-emitter leakage current which compensates with a very good approximation the collector-emitter leakage current of the lateral transistor 76.

The compensation current 75' is therefore equal to the substrate current 79 of the PNP transistor 78 and flowing through the lateral diode 80. If the doped zone or region of PNP transistor 78 is of equal size to the zone or region of transistor 70, then the substrate current 73 of transistor 70 is effectively compensated.

Various changes and modifications can be made within the inventive concept and the construction of the elements formed on the substrate chip itself, such as the resistor 40, diodes and transistors can be made in accordance with known technology and preferably similar to that of the main semiconductor element, the leakage current of which is to be compensated.

The disclosure, the specification, and the claims have been written with relation to a p-substrate; if the substrate is n-type, then the polarities and relationships will be reversed or complimentary, respectively. Therefor, while the notation utilized is graphic and readily understood, the designation of "n" or "p", or "negative" and "positive" (with relation to a source polarity), respectively, are deemed to be only relative with respect to each other or utilized in the sense of symbolic algebraic description and not in the limiting sense referring only to electron conduction or hole conduction properties of materials used.

We claim:

1. Monolithic integrated current source comprising:
 a source of power;
 a first NPN transistor (70) on a substrate (13), the emitter of which is connected to the negative terminal (2) of said power source, said first NPN transistor (70) having a trough remainder current (73); and
 a compensating circuit monolithically integrated on said substrate and connected to the collector of said first NPN transister (70) to compensate said trough remainder current (73) of said NPN transistor (70), said compensation circuit comprising:
 a first lateral PNP transistor (76) having two collectors, the first collector of said first lateral PNP transistor (76) being connected to the collector of said first NPN transistor (70), and the emitter of said first lateral PNP transistor (76) being connected directly to the positive terminal (4) of said power source;
 a second PNP transistor (78), the emitter of said second PNP transistor (78) being connected to the base of said first lateral PNP transistor (76), the base of said second PNP transistor (78) being connected to the second collector of said first PNP transistor (76), and the collector of the second PNP transistor (78) being connected to said substrate (13); and
 a third PNP transistor (81), the base of which is left unconnected, the collector of said third transistor (81) being connected to the base of said first PNP transistor (76) and to the emitter of said second PNP transistor, and the emitter of said third transistor (81) being connected directly to the positive terminal (4) of said power source.

2. Monolithic integrated current source according to claim 1 wherein said second PNP transistor (78) is a vertical substrate transistor.

3. Monolithic integrated current source according to claim 1 wherein said third PNP transistor (81) is a lateral transistor having no galvanic base connection.

* * * * *